(12) United States Patent
Zhou

(10) Patent No.: US 7,099,227 B1
(45) Date of Patent: Aug. 29, 2006

(54) PLD HARDWIRE PROGRAMMING WITH MULTIPLE FUNCTIONAL MODES

(75) Inventor: Shi-dong Zhou, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/759,242

(22) Filed: Jan. 16, 2004

(51) Int. Cl.
*G11C 13/00* (2006.01)

(52) U.S. Cl. .......................... 365/230.03; 365/189.05; 326/40

(58) Field of Classification Search ............ 326/38–41; 365/189.01, 189.05, 230.01, 230.03, 230.08
See application file for complete search history.

(56) References Cited

U.S. PATENT DOCUMENTS

| | | | |
|---|---|---|---|
| 5,530,378 A * | 6/1996 | Kucharewski et al. ........ | 326/41 |
| 5,550,782 A * | 8/1996 | Cliff et al. ............. | 365/230.03 |
| 5,646,545 A | 7/1997 | Trimberger et al. | |
| 5,925,920 A * | 7/1999 | MacArthur et al. ......... | 257/530 |
| 6,288,568 B1 | 9/2001 | Bauer et al. | |
| 6,373,291 B1 * | 4/2002 | Hamada et al. ............. | 326/113 |
| 6,392,467 B1 * | 5/2002 | Oowaki et al. ............. | 327/427 |
| 6,538,468 B1 | 3/2003 | Moore | |

OTHER PUBLICATIONS

Xilinx, Inc., "Hardwire Data Book," 1997, pp. 1-1 to 1-5 and 2-1 to 2-12, available from Xilinx, Inc., 2100 Logic Drive, San Jose, CA 95124.
Xilinx, Inc., "The Programmable Logic Data Book," 1998, pp. 4-1 to 4-40, available from Xilinx, Inc., 2100 Logic Drive, San Jose, CA 95124.

* cited by examiner

*Primary Examiner*—Vibol Tan
(74) *Attorney, Agent, or Firm*—William L. Paradice, III; Justin Liu

(57) ABSTRACT

A configuration control circuit (400) allows a PLD to be quickly re-configured to implement different functions without requiring any configuration memory cells. The control circuit (400) includes a first input (IN1) connected to a first hardwired configuration bit (HCB1), a second input (IN2) connected to a second hardwired configuration bit (HCB2), an output (OUT) connected to one or more of the PLD's configurable elements (110), and a select circuit (402) to selectively connect either the first input (IN1) or the second input (IN2) to the output (OUT) in response to a select signal (SEL).

52 Claims, 12 Drawing Sheets

PLD HARDWIRE PROGRAMMING WITH MULTIPLE FUNCTIONAL MODES

FIELD OF INVENTION

The present invention relates generally to integrated circuits, and more specifically to the configuration of programmable logic devices.

DESCRIPTION OF RELATED ART

One type of integrated circuit (IC) known as a programmable logic device (PLD) is a well-known general purpose device that can be programmed by a user to implement a variety of selected functions. PLDs are becoming increasingly popular with circuit designers because they are less expensive, more flexible, and require less time to implement than custom-designed integrated circuits such as Application Specific Integrated Circuits (ASICs).

There are many types of PLDs such as Field Programmable Gate Arrays (FPGAs) and complex PLDs (CPLDs). For example, an FPGA typically includes an array of configurable logic blocks (CLBs) surrounded by a plurality of input/output blocks (IOBs). The CLBs are individually programmable and can be configured to perform a variety of logic functions. The IOBs are selectively connected to various I/O pins of the FPGA, and can be configured as either input buffers or output buffers. The FPGA also includes a general interconnect structure that can be programmed to selectively route signals among the various CLBs and IOBs to produce more complex logic functions.

The CLBs, IOBs, and the general interconnect structure are typically programmed by loading configuration data into configuration memory cells which control the states of various configurable elements (e.g., switches, multiplexers, function generators, processors, adders, multipliers, memories, and the like) that configure the CLBs, IOBs, and the interconnect structure to implement a desired function. The configuration data is usually stored in a non-volatile memory such as a Programmable Read Only Memory (PROM), an Electrically Erasable PROM (EEPROM), or a Flash memory, and then loaded into the PLD's configuration memory cells during a configuration operation (e.g., upon device power-on).

For many prior PLDs such as the XC4000 family of FPGAs from Xilinx, Inc., each configurable element in the PLD is controlled by a corresponding configuration memory cell. For example, FIG. 1 shows a well-known control circuit 100 that forms the basic control unit for all logic functions in a PLD. Control circuit 100 includes a configuration memory cell 102 and an access transistor 104. The access transistor 104 is connected between a bit line BL and memory cell 102, and has a gate connected to a word line WL. The memory cell 102, which is typically a volatile memory element such as an SRAM (static random access memory) cell, stores a configuration bit that configures the configurable element 110 to a desired state.

PLDs can be re-configured any number of times to implement different functions by loading new configuration data into the PLD's configuration memory cells (e.g., memory cell 102 of FIG. 1) from the non-volatile memory. To take advantage of this capability, some PLDs include a non-volatile memory that can store multiple sets of configuration data so that the PLD can be re-configured to implement different functions defined by the different sets of configuration data without re-programming the non-volatile memory. However, storing multiple sets of configuration data in the non-volatile memory requires larger non-volatile memories, which undesirably increases circuit size, complexity, and cost. In addition, re-configuring a PLD from non-volatile memory is typically a time consuming process that involves, for example, suspending the operation of the logic functions, saving the current state of the logic functions in an external memory device, reloading the entire array of configuration memory cells, and then inputting the states of the logic functions that were saved before re-configuration.

To reduce PLD configuration time, some PLDs include multiple configuration memory cells to store different configuration data for each configurable element. For example, FIG. 2 shows a control circuit 200 of the type disclosed in U.S. Pat. No. 5,646,545, entitled "Time Multiplexed Programmable Logic Device" by Trimberger et al. and issued Jul. 8, 1997, which is incorporated herein by reference. Control circuit 200 includes a RAM (random access memory) bit set 202 having a plurality of memory cells 102(0)–102(n) that are selectively connected via corresponding access transistors 104(0)–104(n) and bit line BL to the data input of a latch 204, which includes an output connected to configurable element 110. Memory cells 102(0)–102(n) can store different configuration bits that can be used to selectively configure the configurable element 110 to different states without accessing non-volatile memory. However, replacing each configuration memory cell in a PLD with a multi-bit RAM as depicted in FIG. 2 can significantly increase the number of configuration memory cells in the PLD, which undesirably increases circuit size, complexity, and cost.

Thus, there is a need for a PLD that can quickly change between different configurations without loading new configuration data from non-volatile memory and without including multiple configuration memory cells for each configurable element.

SUMMARY

In accordance with the present invention, a configuration control circuit allows a PLD to be re-configured quickly to implement different functions without having to access non-volatile memory and without requiring any configuration memory cells. The configuration control circuit includes a first input connected to a first hardwired configuration bit, a second input connected to a second hardwired configuration bit, an output that can be connected to one or more associated configurable elements, and a select circuit that selectively connects the output to either the first input or to the second input in response to a select signal. Thus, the select signal, which can be generated by any suitable circuit or device, determines which hardwired configuration bit the configuration control circuit provides to the one or more configurable elements. For example, when the select signal is in a first state, the configuration control circuit outputs the first hardwired configuration bit, which configures the one or more configurable elements to a corresponding configuration state. Conversely, when the select signal is in a second state, the configuration control circuit outputs the second hardwired configuration bit, which configures the one or more configurable elements to a corresponding configuration state.

For some embodiments, the first and second hardwired configuration bits are different and configure the one or more configurable elements to different configuration states in response to the select signal. For one configuration, the first input is hardwired to a supply voltage and the second input is hardwired to ground potential. For another configuration, the first input is hardwired to ground potential and the second input is hardwired to the supply voltage. For other embodiments, the first and second hardwired configuration bits are the same and configure the one or more configurable elements to the same configuration state, irrespective of the select signal. For one configuration, the first and second inputs are hardwired to ground potential. For another configuration, the first and second inputs are hardwired to the supply voltage.

Because the configuration control circuit can selectively configure the one or more configurable elements to the same or to different states without accessing non-volatile memory and/or without including any configuration memory cells, embodiments of the present invention can save valuable silicon area over PLDs that utilize prior configuration techniques. In addition, the configuration of the PLD's configurable elements can be quickly transitioned from one state to another by changing the state of the select signal, thereby eliminating latencies associated with retrieving new configuration data from a memory array or device.

For some embodiments, the configuration control circuit can include more than two inputs to receive corresponding hardwired configuration bits that can be selectively output to one or more configurable elements in response to a multi-bit select signal. In some embodiments, one or more of the inputs can be provided by sources other than a hardwired configuration bit, for instance a memory cell.

Further, a plurality of the configuration control circuits can form a multi-bit configuration control circuit that can selectively provide different multi-bit sets of configuration data to one or more associated configurable elements in response to the select signal.

For other embodiments, configuration control circuits of the present invention can be used with prior configuration techniques. For one embodiment, a first subset of a PLD's configurable elements can be controlled by the configuration control circuits of the present invention, and a second subset of the PLD's configurable elements can be controlled by one or more prior configuration techniques. For one embodiment, a subset of the PLD's configurable elements can be selectively controlled by either the configuration control circuits of the present invention or by prior configuration techniques. For another embodiment, configuration control circuits of the present invention can be used to control prior configuration techniques.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of an exemplary FPGA for simplicity only. It is to be understood that embodiments of the present invention are equally applicable to any type of programmable or configurable logic including, for example, complex PLDs. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary and, thus, can be modified (e.g., reversed polarity) as desired. Accordingly, the present invention is not to be construed as limited to specific examples described herein but rather includes within its scope all embodiments defined by the appended claims.

Figure 3:
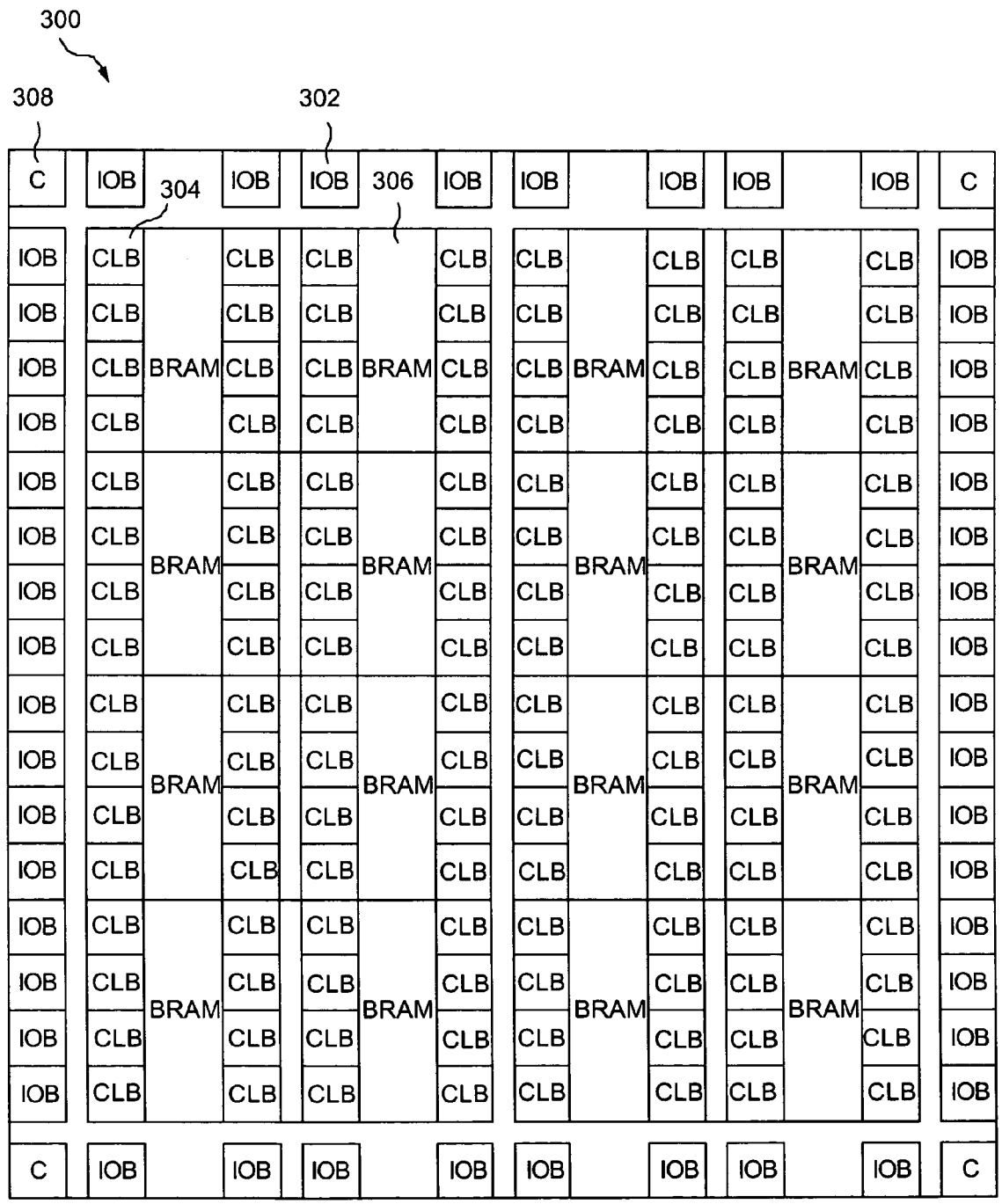
FIG. 3 is a block diagram illustrating the general layout of an FPGA within which embodiments of the present invention can be implemented.

FIG. 3 illustrates the general layout of IOBs, CLBs, and block RAMs (BRAMs) of a field programmable gate array (FPGA) 300 within which embodiments of the present invention can be implemented. IOBs 302 are well-known, and are located around the perimeter of FPGA 300. CLBs 304 are well-known, and are arranged in columns in FPGA 300. Block RAMs 306 are well-known, and are arranged in columns between adjacent CLB columns. A well-known general interconnect circuitry (not shown for simplicity) is provided to programmably connect the IOBs 302, CLBs 304, and block RAMs 306. Corner blocks 308 are well-known, and can contain configuration circuitry and/or can be used to provide additional routing resources. The IOBs 302, CLBs 304, block RAM 306, corner blocks 308, and interconnect structure each contain one or more configurable elements 110 (not shown in FIG. 3 for simplicity) that configure FPGA 300 to implement desired functions. Although a particular FPGA layout is illustrated in FIG. 3, it is to be understood that many other FPGA layouts are possible, and are considered to fall within the scope of the present invention. For example, other embodiments can have other numbers of IOBs 302, CLBs 304, and block RAMs 306, and can have other types of blocks, such as multipliers and/or processors. A more detailed description of the general operation of FPGA 300 is provided in "The Programmable Logic Data book 1998" pp. 4–1 to 4–40, which is available from Xilinx, Inc. of San Jose, Calif., and incorporated by reference herein.

Figure 4A:
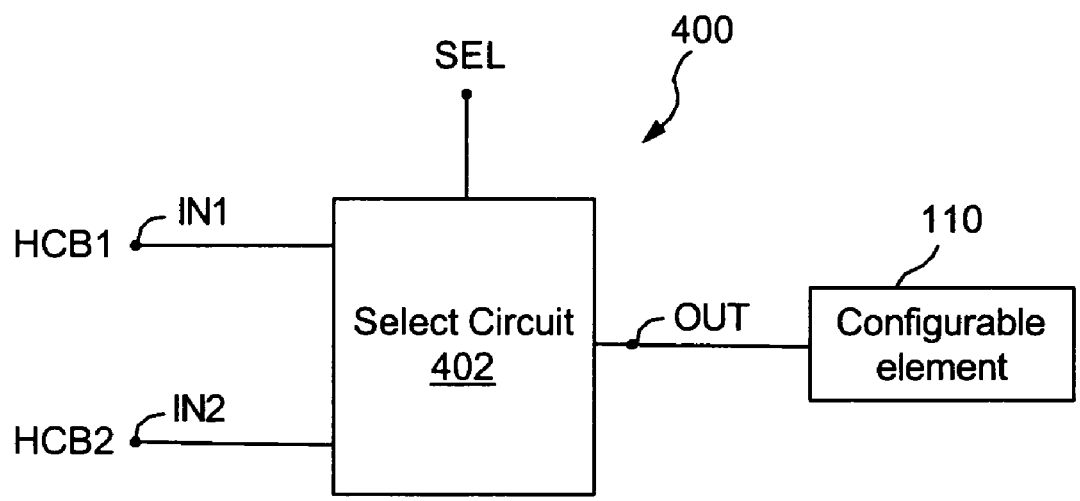
FIG. 4A is a block diagram of a configuration control circuit in accordance with one embodiment of the present invention.

FIG. 4A shows a configuration control circuit 400 that can be used to selectively configure a configurable element 110 in a PLD (e.g., FPGA 300) to different configuration states or to the same configuration state without including or accessing any memory cell or device. Configurable element 110 can be any logic or circuit whose function can be controlled or modified using one or more configuration bits. Further, although illustrated in FIG. 4 as controlling one configurable element 110, configuration control circuit 400 can be used to control the configuration of any number of configurable elements 110.

Configuration control circuit 400 includes first and second inputs IN1 and IN2, an output OUT, and a select circuit 402. The first input IN1 is connected to a first hardwired configuration bit HCB1, and the second input IN2 is connected to a second hardwired configuration bit HCB2. Select circuit 402, which does not include any memory cells or memory elements, can be any suitable circuit that selectively connects either IN1 or IN2 to OUT in response to a select signal SEL. For example, when SEL is in a first state, select circuit 402 connects IN1 to OUT and thereby outputs HCB1 to configure the configurable element 110 to a configuration state indicated by HCB1. Conversely, when SEL is in a second state, select circuit 402 connects IN2 to OUT and thereby outputs HCB2 to configure the configurable element 110 to a configuration state indicated by HCB2.

Figure 4B:
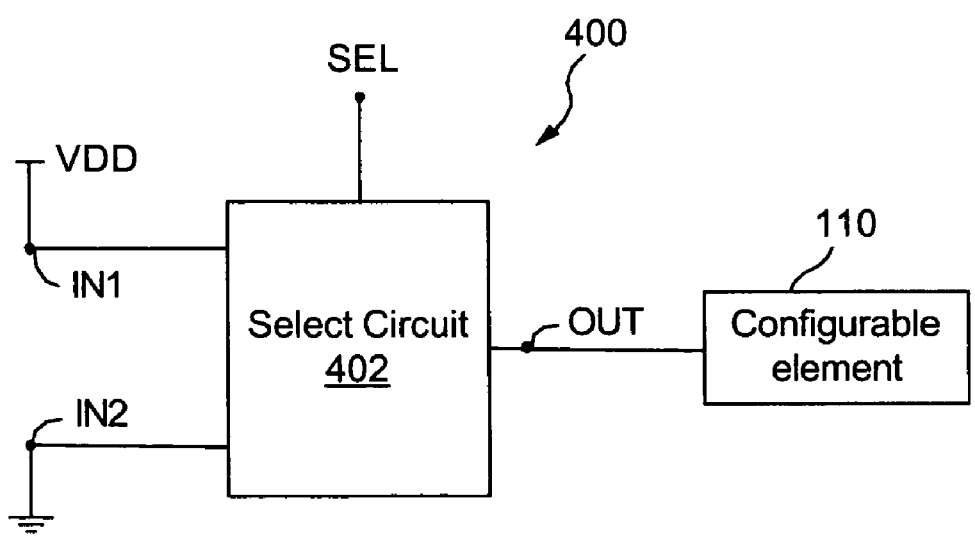
FIG. 4B shows the configuration control circuit of FIG. 4A having a first hardwired input configuration.
Figure 4C:
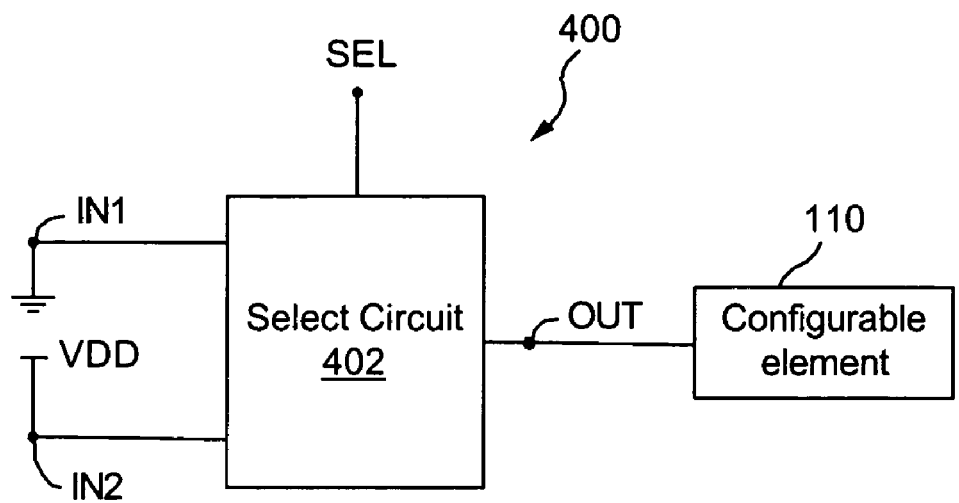
FIG. 4C shows the configuration control circuit of FIG. 4A having a second hardwired input configuration.

For some embodiments, HCB1 and HCB2 are different hardwired configuration bits that configure the configurable element 110 to different states in response to SEL. For one configuration, IN1 is hardwired to a supply voltage VDD (e.g., HCB1 is logic high) and IN2 is hardwired to ground potential (e.g., HCB2 is logic low), as shown in FIG. 4B, so that control circuit 400 configures the configurable element 110 to a first configuration state when SEL is in the first state and configures the configurable element 110 to a second configuration state when SEL is in the second state. For another configuration, IN1 is hardwired to ground potential (e.g., HCB1 is logic low) and IN2 is hardwired to VDD (e.g., HCB2 is logic high), as shown in FIG. 4C, so that control circuit 400 configures the configurable element 110 to the second configuration state when SEL is in the first state and configures the configurable element 110 to the first configuration state when SEL is in the second state.

Figure 4D:
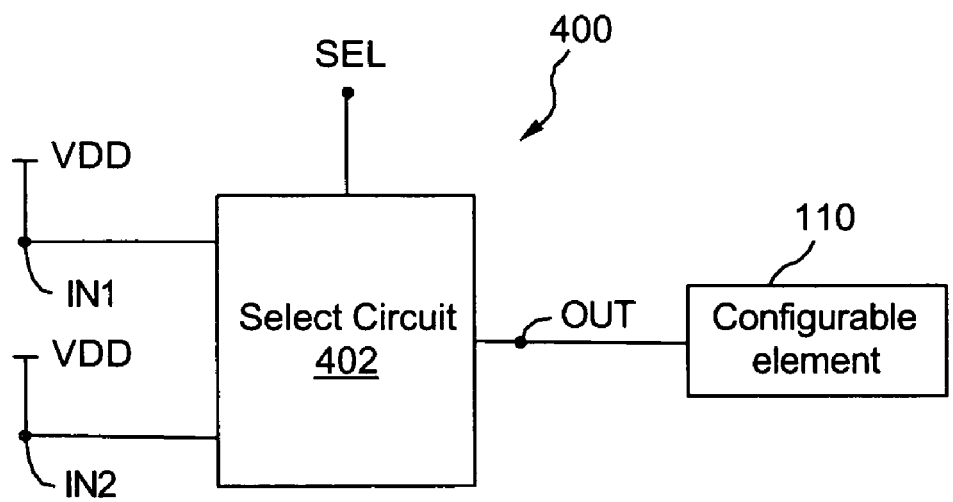
FIG. 4D shows the configuration control circuit of FIG. 4A having a third hardwired input configuration.
Figure 4E:
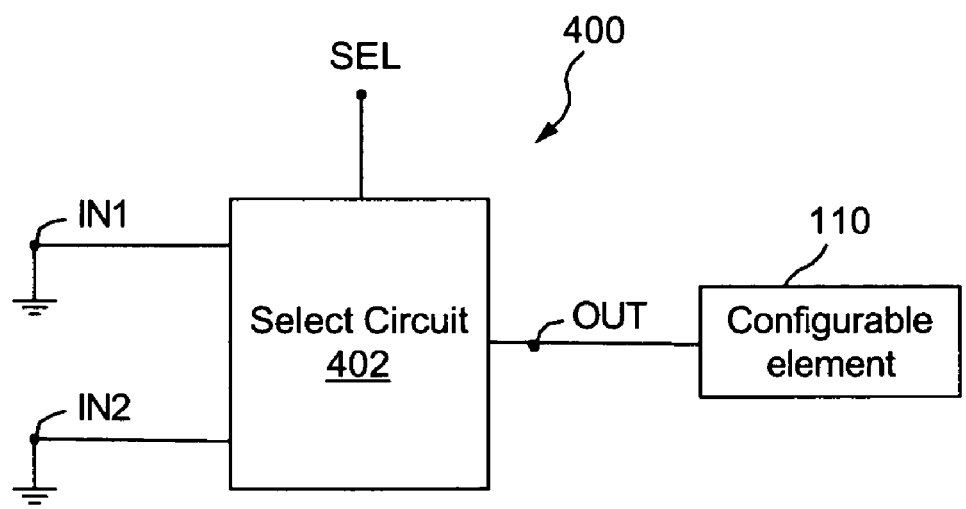
FIG. 4E shows the configuration control circuit of FIG. 4A having a fourth hardwired input configuration.

For other embodiments, HCB1 and HCB2 are the same hardwired configuration bit that configures the configurable element 110 to the same state, irrespective of SEL. For one configuration, IN1 and IN2 are both hardwired to VDD (e.g., HCB1 and HCB2 are logic high), as shown in FIG. 4D, so that control circuit 400 configures the configurable element 110 to the first configuration state, irrespective of SEL. For another configuration, IN1 and IN2 are both hardwired to ground potential (e.g., HCB1 and HCB2 are logic low), as shown in FIG. 4E, so that control circuit 400 configures the configurable element 110 to the second configuration state, irrespective of SEL.

The select signal SEL can be generated in any suitable manner and/or in response to any suitable event or condition. For some embodiments, SEL is generated internally by a suitable logic element, memory element, processor, state machine, or other well-known component embedded within the PLD (e.g., within FPGA 300). For example, during operation of FPGA 300, a processor (not shown) embedded in FPGA 300 can change the configuration of configurable element 110 by transitioning SEL to a new state. For other embodiments, SEL can be generated externally and provided to the FPGA via one of its input pins (not shown for simplicity). For example, during operation of FPGA 300, a user can change the configuration of configurable elements 110 in FPGA 300 by changing the state of the select signal provided to the FPGA's corresponding SEL input pin.

As described above, configuration control circuit 400 can selectively provide the same or different configuration bits to configurable element 110 without including any memory cells. Accordingly, a PLD that incorporates configuration control circuits 400 can switch between PLD configurations without using any memory cells or other devices for storing configuration data. The ability to eliminate configuration memory cells and/or non-volatile memory from a PLD while retaining the ability to implement different PLD configurations can significantly reduce circuit size, complexity, and cost of the PLD, as well as eliminating latencies associated with retrieving data from a memory array or device.

Figure 5A:
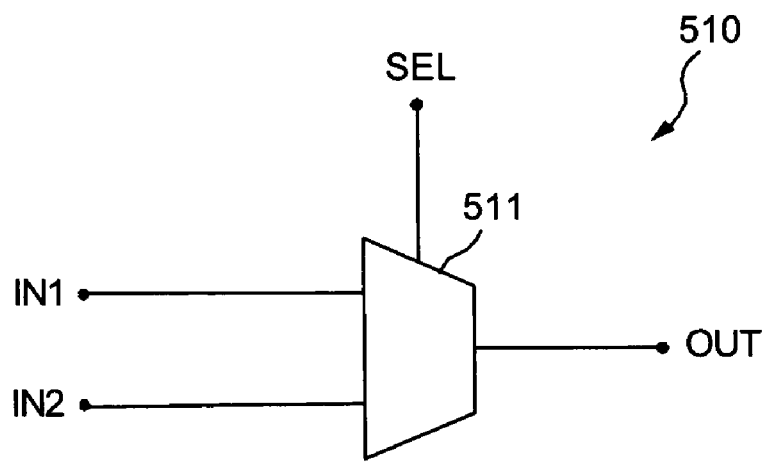
FIG. 5A is a circuit diagram of one embodiment of the configuration control circuit of FIG. 4A.

FIG. 5A shows a configuration control circuit 510 that is one embodiment of configuration control circuit 400 of FIG. 4A. Control circuit 510 includes a multiplexer (MUX) 511 having a first input connected to IN1, a second input connected to IN2, an output connected to OUT, and a control terminal to receive SEL. MUX 511 operates as a select circuit that connects either IN1 or IN2 to OUT in response to SEL.

Figure 5B:
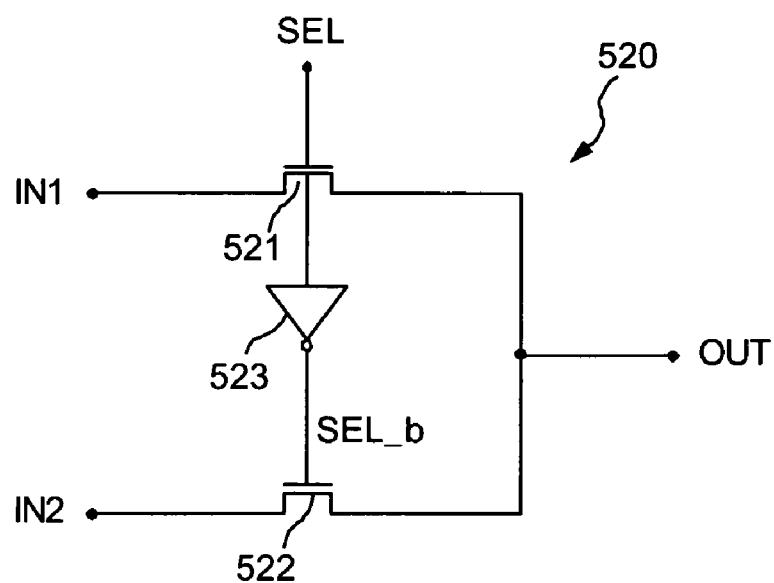
FIG. 5B is a circuit diagram of another embodiment of the configuration control circuit of FIG. 4A.

FIG. 5B shows a configuration control circuit 520 that is another embodiment of configuration control circuit 400 of FIG. 4A. Configuration control circuit 520 includes NMOS transistors 521–522 and an inverter 523 that form a select circuit to connect either IN1 or IN2 to OUT in response to SEL. Transistor 521 is connected between IN1 and OUT, and has a gate to receive SEL. Transistor 522 is connected between IN2 and OUT, and has a gate to receive a complemented select signal SEL_b generated in response to SEL by inverter 523. Inverter 523 can be any suitable logic inverter such as a well-known CMOS inverter. For an exemplary operation, when SEL is logic high, NMOS transistor 521 turns on and connects OUT to IN1, the hardwired logic state of which configures associated configurable element(s) 110 to a corresponding configuration state. Inverter 523 inverts the logic high state of SEL to generate a logic low SEL_b, which turns off NMOS transistor 522 to isolate OUT from IN2. Conversely, when SEL is logic low, NMOS transistor 521 turns off and isolates OUT from IN1. Inverter 523 inverts the logic low state of SEL to generate a logic high SEL_b, which turns on NMOS transistor 522 to connect OUT to IN2, the hardwired logic state of which configures associated configurable element(s) 110 to a corresponding configuration state. For other embodiments of control circuit 510, NMOS transistors 521–522 can be replaced by PMOS transistors.

Figure 5C:
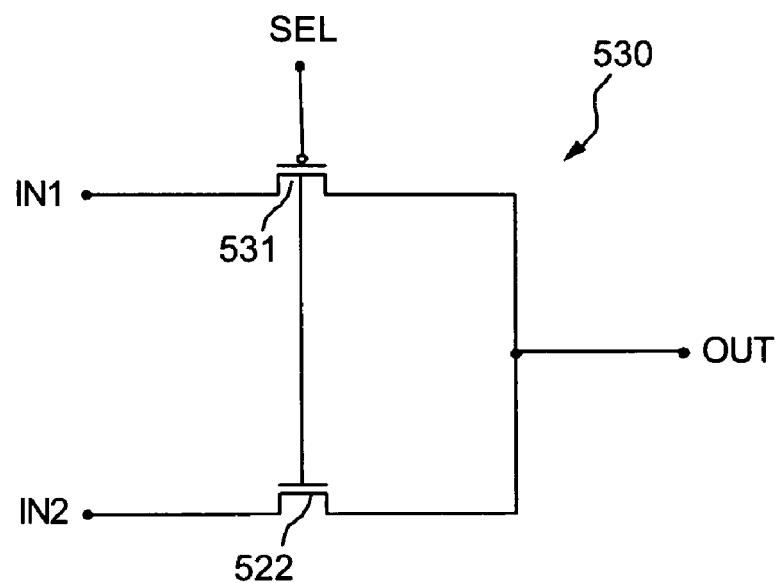
FIG. 5C is a circuit diagram of yet another embodiment of the configuration control circuit of FIG. 4A.

FIG. 5C shows a configuration control circuit 530 that is another embodiment of configuration control circuit 400 of FIG. 4A. Control circuit 530 is similar to control circuit 520, except that inverter 523 is eliminated and NMOS transistor 521 is replaced by a PMOS transistor 531. For this embodiment, PMOS transistor 531 and NMOS transistor 522 form a circuit that connects either IN1 or IN2 to OUT in response to SEL. For other embodiments, PMOS transistor 531 can be replaced by an NMOS transistor and NMOS transistor 522 can be replaced by a PMOS transistor.

For other embodiments, configuration control circuit 400 can receive more than two hardwired configuration bits that can be selectively provided to one or more configurable elements 110 in response to a multi-bit select signal SEL.

Figure 6:
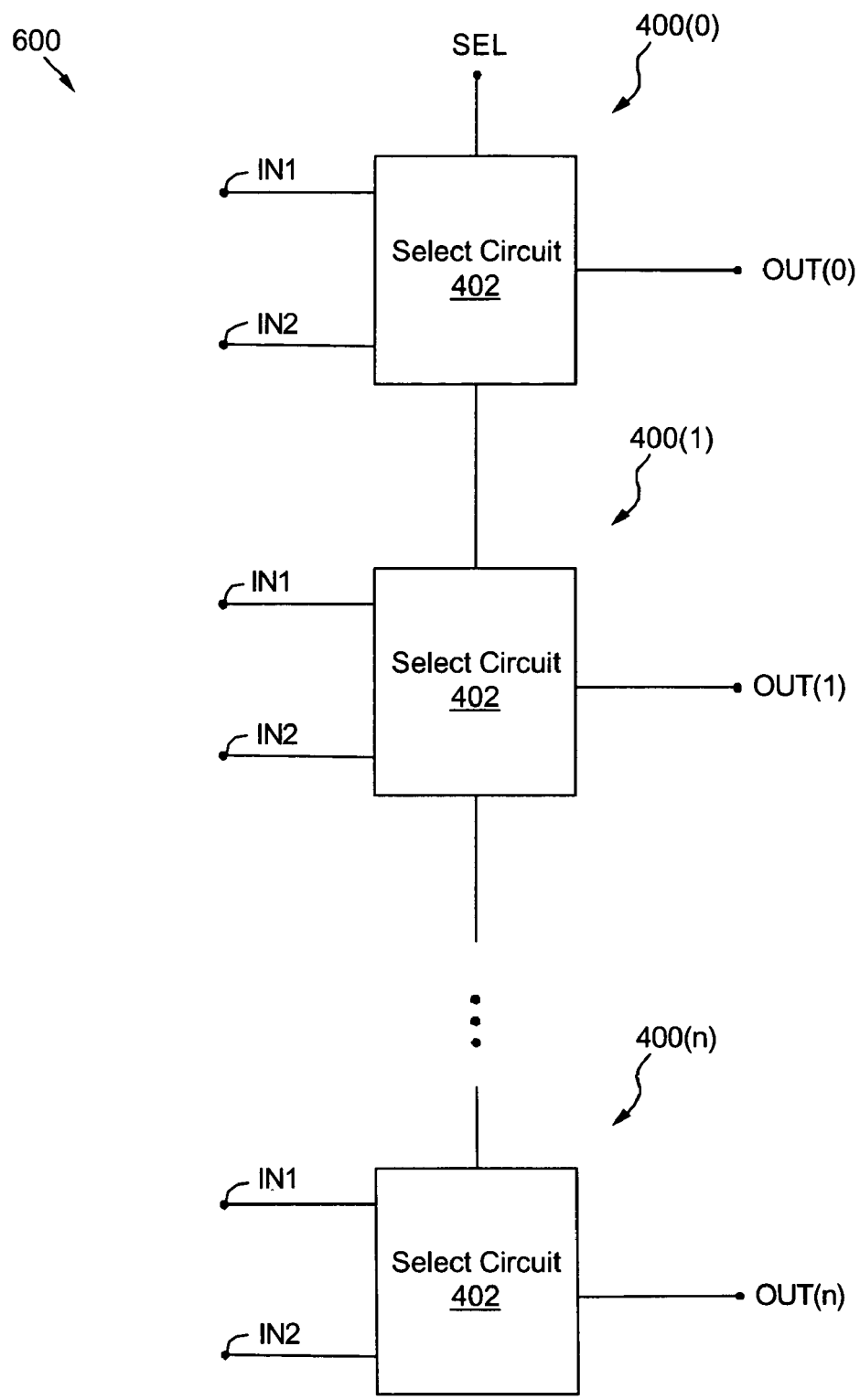
FIG. 6 is a block diagram showing a plurality of the configuration control circuits of FIG. 4A connected together to form a multi-bit configuration control circuit.

Multiple control circuits 400 can form a multi-bit configuration control circuit that can selectively provide different multi-bit configuration data to one or more configurable elements 110 in response to SEL. For example, FIG. 6 shows a multi-bit configuration control circuit 600 that includes a plurality of configuration control circuits 400(0)–400(n), each of which can selectively provide a configuration bit on corresponding outputs OUT(0)–OUT(n) in response to SEL. As explained above, the configuration bits provided on outputs OUT(0)–OUT(n) in response to a given state of SEL are determined by the hardwired input configuration of the corresponding configuration control circuit 400(0)–400(n). In this manner, the hardwired configuration bits provided on OUT(0)–OUT(n) by respective control circuits 400(0)–400(n) in response to a given state of SEL can be individually selected to configure corresponding configurable elements 110 to desired configuration states.

For some embodiments, the IN1 and IN2 inputs of the configuration control circuits 400 provided within a PLD are selectively hardwired to configuration bits (e.g., which can be indicated by connections to VDD or ground potential) using a suitable mask during formation of the PLD's metal signal-routing layer. Thus, a PLD manufacturer can produce PLDs having different sets of predetermined, user-selectable configurations in accordance with present embodiments by using different metal masks during fabrication. Accordingly, the PLD manufacturer can build many different PLDS having different, user-selectable configurations for various customers by changing only the metal-layer mask used during fabrication, which can significantly reduce the time to market for new products. Further, the ability to hardwire a PLD for different, user-selectable functions allows such PLDs to compete in markets for devices having predetermined configurations such as, for example, the ASIC market. However, unlike conventional ASICs, PLDs incorporating embodiments of the present invention can transition between different configurations, and are typically less expensive to develop.

PLDs that incorporate embodiments of the present invention are particularly advantageous for applications that need to change among predetermined configurations or states quickly. For example, a manufacturer desiring to offer a mobile phone that can rapidly change between CDMA and GSM phone configurations so that the phone can operate in either a CDMA-standard network or a GSM-standard network can utilize a PLD incorporating embodiments of the present invention. Thus, rather than including two different ASICs to implement the two different phone standards, the mobile phone can include a single PLD having configurable elements that are controlled by configuration control circuits 400. More specifically, for this example, the IN1 and IN2 inputs of configuration control circuits 400 of a PLD can be selectively hardwired to VDD and/or to ground potential to configure the PLD to implement CDMA phone operations when SEL is in a first state and to implement GSM phone operations when SEL is in a second state. In this manner, the mobile phone can be quickly switched between CDMA and GSM operational modes without retrieving data from a memory array or device. Further, the reductions in circuit size and power-consumption realized by the elimination of the PLD's non-volatile memory and/or configuration memory cells for portable devices such as mobile phones can provide a significant commercial advantage.

As mentioned above, the configuration control circuits of the present invention can be used to control the configuration of any configurable element within a PLD. For example, FIGS. 7–11 show various examples of configurable elements that can be controlled by embodiments of the present invention. However, it is to be understood that embodiments of the present invention can be used to control other configurable elements not specifically shown in FIGS. 7–11.

Figure 7:
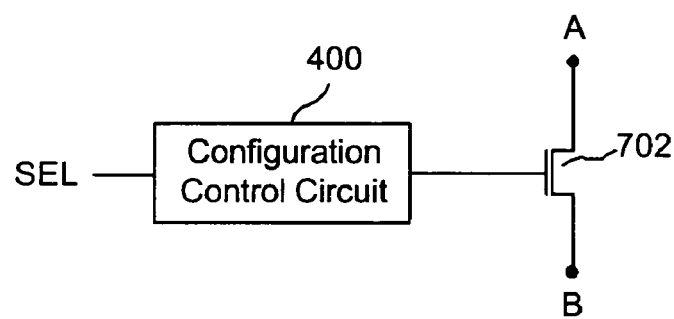
FIG. 7 is a block diagram showing the configuration control circuit of FIG. 4A controlling a pass gate.

FIG. 7 shows configuration control circuit 400 controlling a pass transistor 702 connected between nodes A and B. For an exemplary operation, when SEL is in a first state, control circuit 400 outputs a logic high signal that turns on pass transistor 702 to connect nodes A and B together. When SEL is in a second state, control circuit 400 outputs a logic low signal that turns off pass transistor 702 to de-couple nodes A and B from each other.

Figure 8:
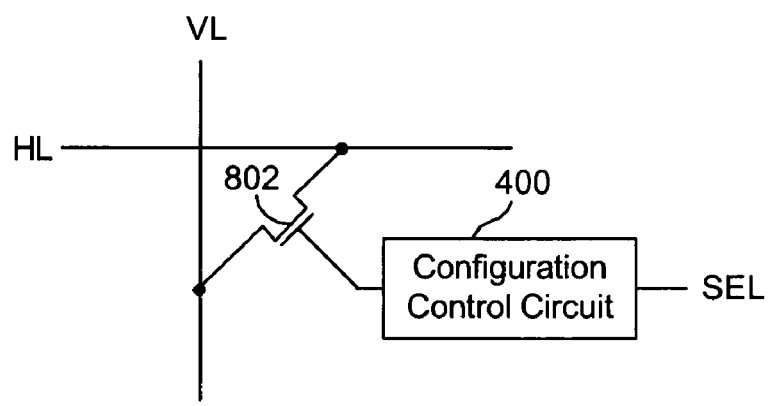
FIG. 8 is a block diagram showing the configuration control circuit of FIG. 4A controlling a switch.

FIG. 8 shows configuration control circuit 400 controlling a switch 802. Switch 802, which is depicted as a pass transistor connected between a vertical signal line VL and a horizontal signal line HL and having a gate coupled to the output of control circuit 400, can be any suitable switch and can be part of a switch matrix, an interconnect structure, or other signal routing resource. For an exemplary operation, when SEL is in a first state, switch 802 connects lines VL and HL. When SEL is in a second state, switch 802 disconnects lines VL and HL.

Figure 9:
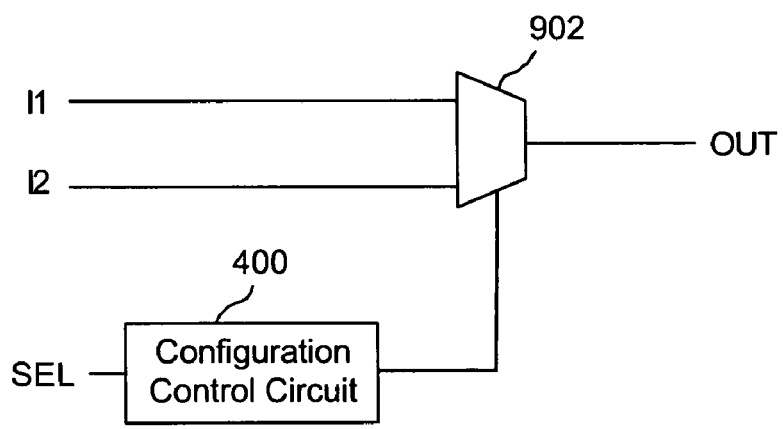
FIG. 9 is a block diagram showing the configuration control circuit of FIG. 4A controlling a multiplexer.

FIG. 9 shows configuration control circuit 400 controlling a multiplexer (MUX) 902. For an exemplary operation, when SEL is in a first state, control circuit 400 causes MUX 902 to pass the signal on I1 to the output OUT. When SEL is in a second state, control circuit 400 causes MUX 902 to pass the signal on I2 to OUT.

Figure 10:
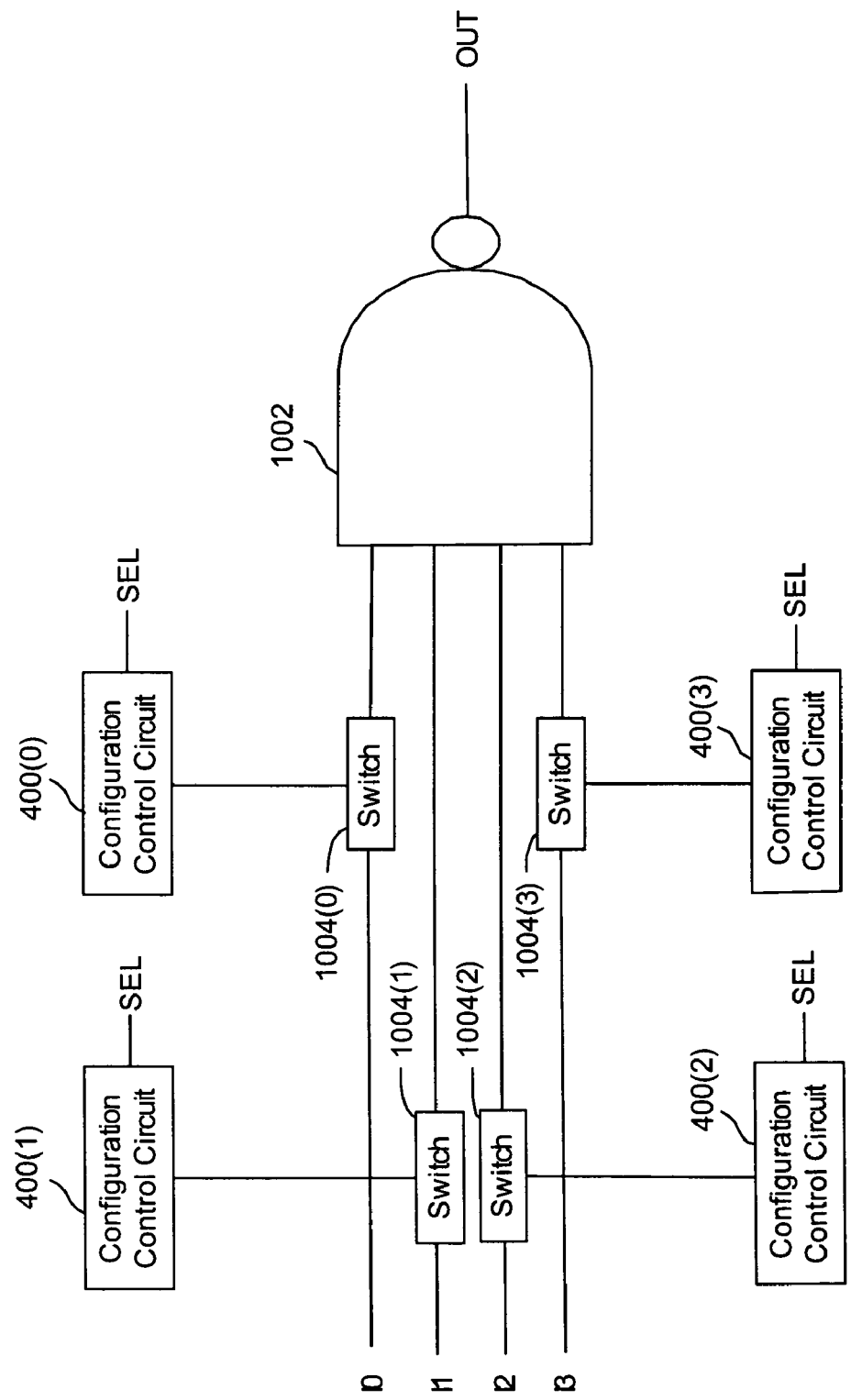
FIG. 10 is a block diagram showing a plurality of the configuration control circuits of FIG. 4A controlling corresponding inputs of a logic gate.

FIG. 10 shows a plurality of configuration control circuits 400(0)–400(3) that control the inputs to a 4-input logic gate 1002, although in other embodiments logic gate 1002 can have other numbers of inputs. Further, although shown in FIG. 10 as a NAND gate, for other embodiments logic gate 1002 can be another type of logic gate such as, for example, a NOR gate or an XNOR gate. The output of each control circuit 400(0)–400(3) is connected to a control terminal of a corresponding switch 1004(0)–1004(3), each of which selectively connects a corresponding input signal IN0–IN3 to logic gate 1002. The hardwired input configuration of each control circuit 400(0)–400(3) determines whether the corresponding switch 1004 passes its input signal to logic gate 1002 when SEL is in a given state. For some embodiments, switches 1004(0)–1004(3) can be well-known tri-state switches that can tri-state the inputs of logic gate 1002 when the corresponding input signals are not provided to logic gate 1002. For other embodiments, switches 1004(0)–1004(n) can be NMOS or PMOS transistors.

Figure 11:
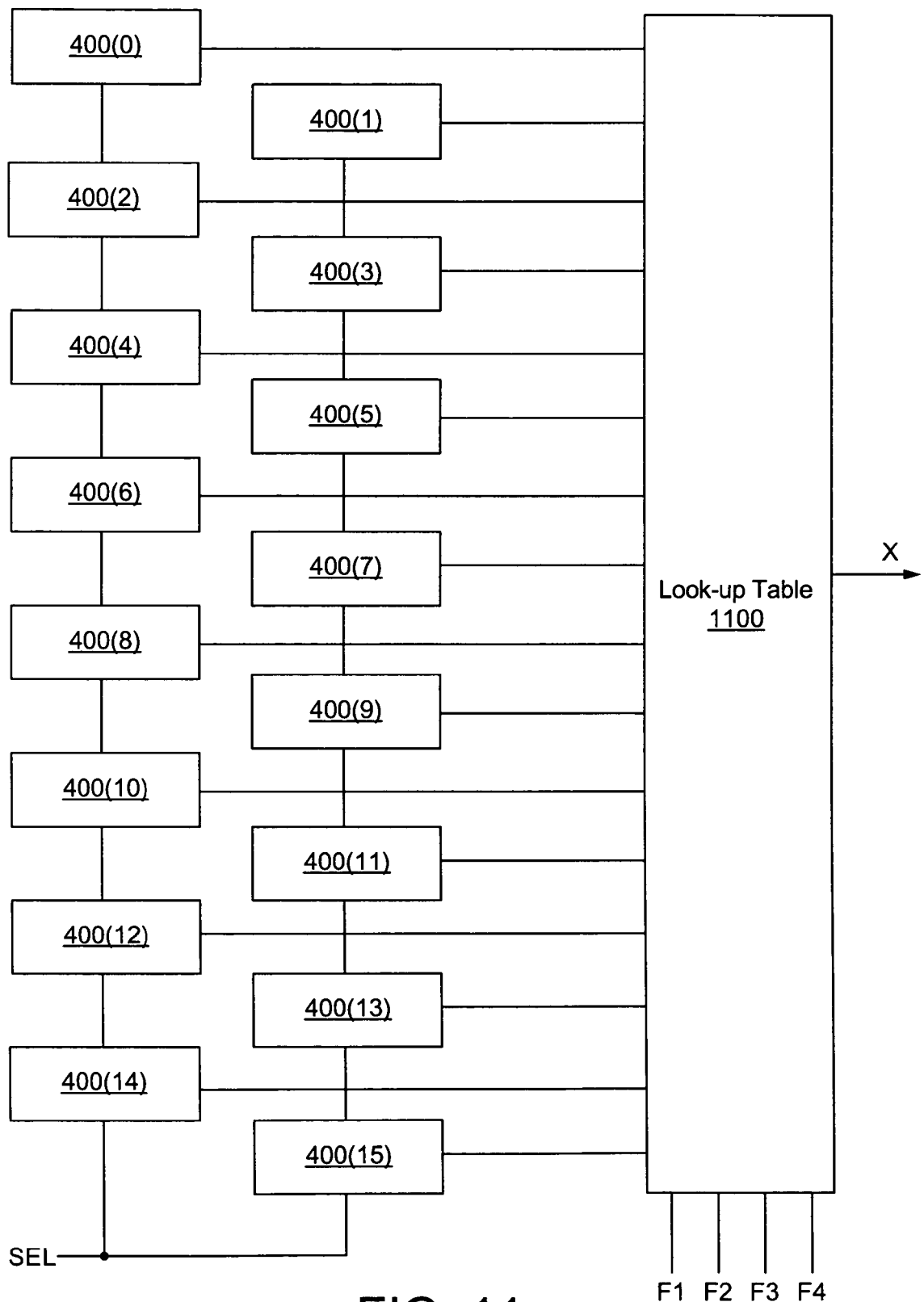
FIG. 11 is a block diagram showing a plurality of the configuration control circuits of FIG. 4A controlling the configuration of a look-up table.

FIG. 11 shows a plurality of configuration control circuits 400(0)–400(15) connected to corresponding data inputs of a 16-bit look-up table (LUT) 1100. LUT 1100, which can be used in a well-known manner to implement a 4-input function generator in many FPGA devices available from Xilinx, Inc., includes sixteen storage locations (not shown in FIG. 11) connected to outputs of corresponding control circuits 400(0)–400(15). For some embodiments, LUT 1100 can be of the type disclosed in U.S. Pat. No. 6,288,568, which is incorporated herein by reference, although other LUT architectures can be used. During power-up, each of control circuits 400(0)–400(15) selectively provides a configuration bit (e.g., either a hardwired logic low signal or a hardwired logic high signal) to a corresponding register location in LUT 1100 in response to SEL. The logic function performed by LUT 1100, which selects one of the bits stored in its 16 register locations to output as X in response to input signals F1–F4, can be quickly re-configured to implement a different function by changing the state of SEL.

As described above, embodiments of the present invention can be used to selectively provide different configuration data to one or more configurable elements 110 without including or accessing any memory cell, array, or device. Thus, for some embodiments, each configurable element 110 within FPGA 300 is controlled using configuration control circuits 400.

Figure 1:
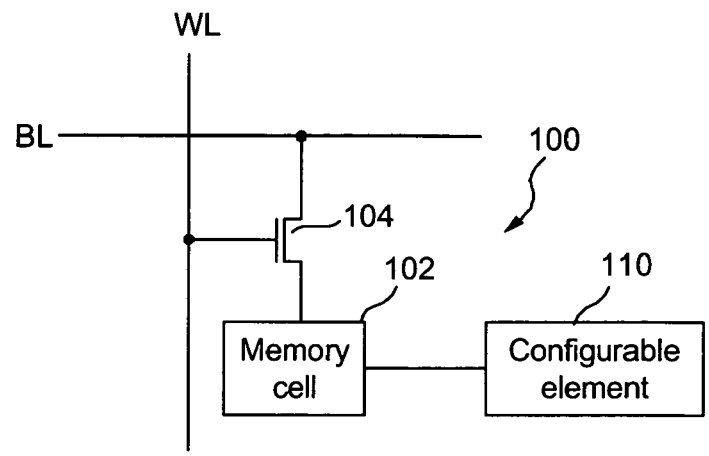
FIG. 1 is a circuit diagram illustrating a prior technique of controlling a configurable element with a memory cell.
Figure 2:
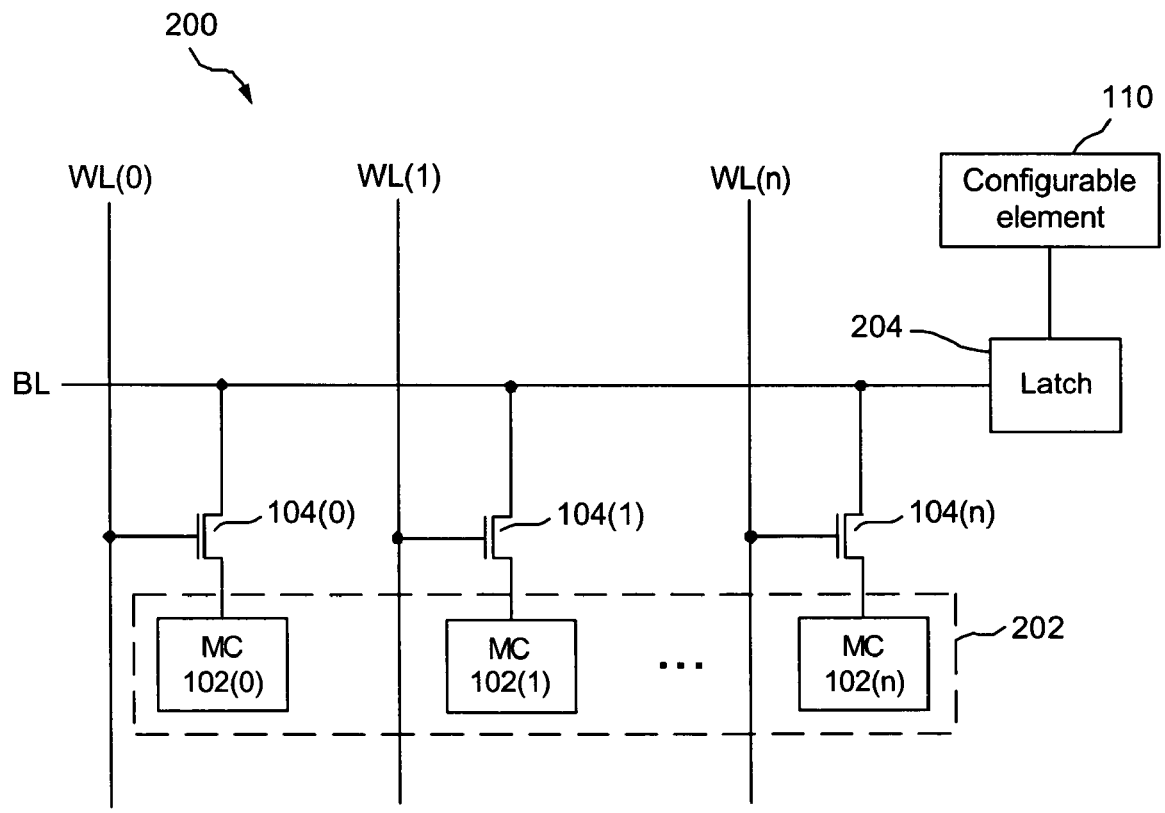
FIG. 2 is a circuit diagram illustrating a prior technique of controlling a configurable element with a plurality of memory cells.

Configuration control circuits of the present invention can also be used with prior configuration techniques. For some embodiments, a first subset of a PLD's configurable elements can be controlled by configuration control circuits 400 while a second subset of the PLD's configurable elements can be controlled by configuration memory cells such as, for example, memory cells 102 of FIGS. 1 and 2. For other embodiments, one or more of the configurable elements of a PLD such as FPGA 300 can be selectively configured either by control circuits 400 or by conventional configuration techniques.

Figure 12:
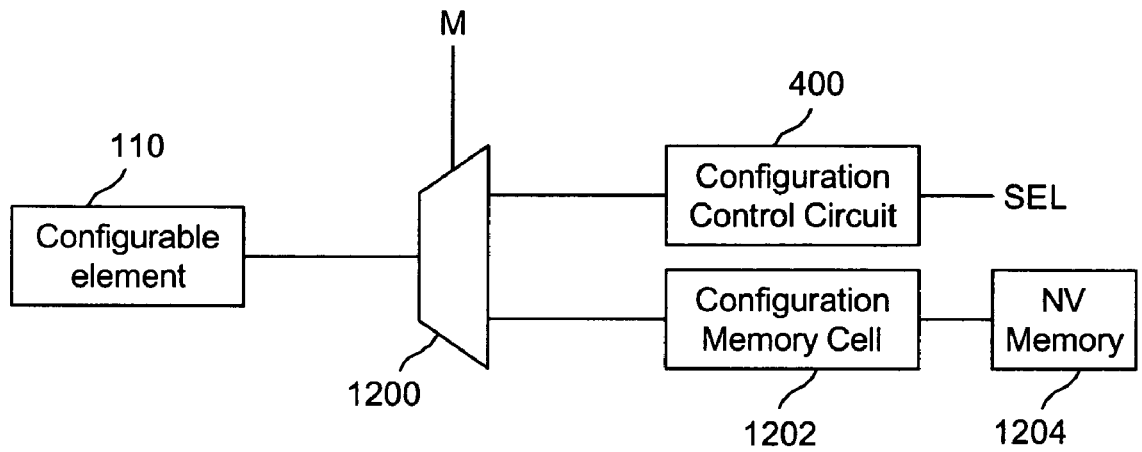
FIG. 12 is a block diagram showing a configurable element selectively controlled by the configuration control circuit of FIG. 4A and a prior configuration technique.

For example, FIG. 12 shows a configurable element 110 that can be selectively configured either by configuration control circuit 400 or by a configuration memory cell 1202 via a multiplexer (MUX) 1200 in response to a mode signal M. The mode signal can be generated internally, or can be generated externally (e.g., by a user) and provided to the FPGA as an input signal. For an exemplary operation, when M is in a first state, control circuit 400 provides hardwired configuration data to configurable element 110 in response to SEL via MUX 1200. When M is in a second state, configuration data stored in configuration memory cell 1202 is provided to configurable element 110 via MUX 1200. For some embodiments, configuration data can be loaded into configuration memory cell 1202 via a non-volatile memory 1204, as illustrated in FIG. 12. As previously noted in connection with configuration control circuit 400, MUX 1200 may have more than two inputs that can be selectively provided to one or more configurable elements 110 in response to a multi-bit mode signal M.

Figure 13:
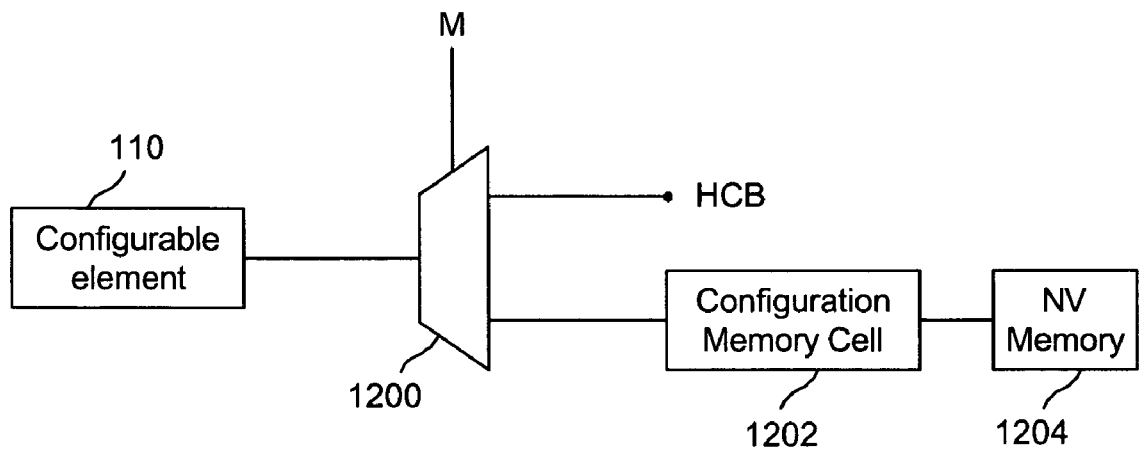
FIG. 13 is a block diagram showing a configurable element selectively controlled by a hardwired configuration bit and a prior configuration technique.

FIG. 13 shows a configurable element 110 that can be selectively configured either by a hardwired configuration bit HCB or by configuration memory cell 1202 via MUX 1200 in response to the mode signal M. In some embodiments, mode signal M may be shared with select signal SEL. For an exemplary operation, when M is in the first state, MUX 1200 provides HCB to configurable element 110. When M is in the second state, MUX 1200 provides configuration data stored in configuration memory cell 1202 to configurable element 110. For some embodiments, HCB can be hardwired to VDD (e.g., a logic high state). For other embodiments, HCB can be hardwired to ground potential (e.g., a logic low signal).

Figure 14:
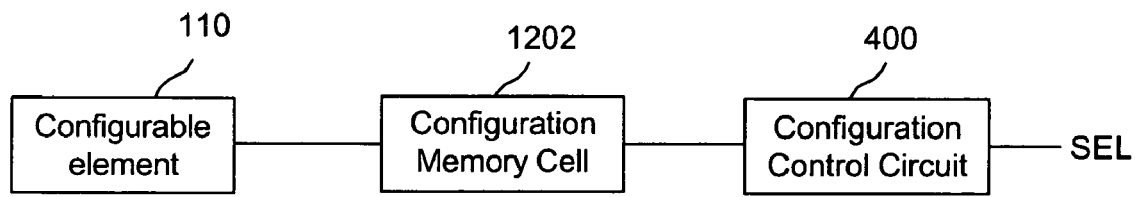
FIG. 14 is a block diagram showing the configuration control circuit of FIG. 4A controlling a prior configuration memory cell.

FIG. 14 shows a block diagram of a configurable element 110 that receives configuration data from configuration memory cell 1202, which in turn can be selectively programmed by configuration control circuit 400 in response to SEL. In this manner, configuration control circuits 400 can be used (e.g., rather than a non-volatile memory) to program configuration memory cells 1202 that control various configurable elements 110 in a PLD.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although described above as being hardwired to either VDD or to ground potential, the inputs of configuration control circuits in accordance with the present invention can be hardwired to other suitable voltage levels or signals to selectively provide configuration bits to one or more corresponding configurable elements.

What is claimed is:

1. An integrated circuit (IC) comprising:
   a first number of configurable elements; and
   a second number of configuration control circuits, each having an output to control the configuration of one or more corresponding configurable elements, and each comprising:
      a first input connected to a first configuration bit;
      a second input connected to a second configuration bit; and
      a select circuit to selectively provide either the first configuration bit or the second configuration bit to the one or more corresponding configurable elements in response to a select signal;
   wherein a first subset of the configurable elements are controlled by the configuration control circuits and a second subset of the configurable elements are controlled by one or more configuration memory cells.

2. The IC of claim 1, wherein each of the first configuration bits is a first hardwired configuration bit.

3. The IC of claim 2, wherein each of the second configuration bits is a second hardwired configuration bit.

4. The IC of claim 3, wherein the first and second hardwired configuration bits configure the one or more corresponding configurable elements to different configuration states.

5. The IC of claim 3, wherein the first input is hardwired to a supply voltage and the second input is hardwired to ground potential.

6. The IC of claim 3, wherein the first input is hardwired to ground potential and the second input is hardwired to a supply voltage.

7. The IC of claim 3, wherein the first and second hardwired configuration bits configure the one or more corresponding configurable elements to the same configuration state.

8. The IC of claim 7, wherein the first and second inputs are hardwired to a supply voltage.

9. The IC of claim 7, wherein the first and second inputs are hardwired to ground potential.

10. The IC of claim 1, wherein the configuration control circuits do not include any memory cells.

11. The IC of claim 1, wherein the select circuit comprises a multiplexer.

12. The IC of claim 1, wherein the select circuit comprises an inverter.

13. The IC of claim 1, wherein the select circuit comprises:

a first transistor connected between the first input and the output and having a gate responsive to the select signal; and a second transistor connected between the second input and the output and having a gate responsive to a complement of the select signal.

14. The IC of claim 13, wherein the first transistor comprises an NMOS transistor and the second transistor comprises a PMOS transistor.

15. The IC of claim 13, wherein the first and second transistors comprise NMOS transistors, and each configuration control circuit further comprises an inverter having an input connected to the gate of the first transistor and having an output connected to the gate of the second transistor.

16. The IC of claim 1, wherein the select signal is generated within the IC.

17. The IC of claim 1, wherein the select signal comprises an external signal provided to an input pin of the IC.

18. The IC of claim 1, wherein the one or more configuration memory cells are programmed by selected ones of the configuration control circuits.

19. The IC of claim 1, wherein each of the configuration control circuits further comprises:

a configuration memory cell connected to the first input for providing the first configuration bit.

20. The IC of claim 1, further comprising:

a configuration memory cell; and a multiplexer having a first input coupled to an output of the configuration memory cell, a second input coupled to the output of a corresponding configuration control circuit, an output coupled to a corresponding configurable element, and a control terminal to receive a mode signal.

21. The IC of claim 20, wherein the mode signal is provided to an input pin of the IC.

22. The IC of claim 20, wherein the mode signal is generated within the IC.

23. The IC of claim 20, wherein the configuration memory cell has an input terminal connected to the output of a corresponding configuration control circuit.

24. The IC of claim 1, further comprising a plurality of configuration memory cells, each coupled between corresponding configurable elements and configurable control circuits.

25. The IC of claim 1, wherein the configurable element comprises a pass gate.

26. The IC of claim 1, wherein the configurable element comprises a multiplexer.

27. The IC of claim 1, wherein the configurable element comprises a logic gate.

28. The IC of claim 1, wherein the configurable element comprises a look-up table.

29. The IC of claim 1, wherein each of the configurable control circuits further comprises one or more additional inputs each connected one or more corresponding configuration bits, wherein the select circuit selectively provides one of the first, second, or one or more configuration bits to the one or more corresponding configurable elements in response to the select signal.

30. An integrated circuit (IC), comprising:

one or more configurable elements; and means for selectively providing either a first hardwired configuration bit or a second hardwired configuration bit to the one or more configurable elements in response to a select signal;

wherein the first hardwired configuration bit is hardwired to one of a supply voltage and a around potential; and wherein the second hardwired configuration bit is hardwired to one of the supply voltage and the around potential.

31. The IC of claim 30, wherein the means for selectively providing does not include any memory cells.

32. The IC of claim 30, wherein the first and second hardwired configuration bits configure the one or more configurable elements to different configuration states.

33. The IC of claim 32, wherein the first hardwired configuration bit comprises a supply voltage and the second hardwired configuration bit comprises ground potential.

34. The IC of claim 30, wherein the first and second hardwired configuration bits configure the one or more configurable elements to the same configuration state.

35. The IC of claim 34, wherein the first and second hardwired configuration bits comprise a supply voltage.

36. The IC of claim 34, wherein the first and second hardwired configuration bits comprise ground potential.

37. The IC of claim 30, wherein the means for selectively providing comprises a multiplexer.

38. The IC of claim 30, wherein the means for selectively providing comprises:

a first transistor connected between the first hardwired configuration bit and the configurable element and having a gate responsive to the select signal; and a second transistor connected between the second hardwired configuration bit and the configurable element and having a gate responsive to a complement of the select signal.

39. The IC of claim 30, wherein the select signal is generated within the IC.

40. The IC of claim 30, wherein the select signal comprises an external signal provided to an input pin of the IC.

41. The IC of claim 30, wherein a first subset of the configurable elements are controlled by the configuration control circuits and a second subset of the configurable elements are controlled by a plurality of configuration memory cells.

42. An integrated circuit (IC) comprising:

a first number of configurable elements; and a second number of configuration control circuits, each having one or more outputs connected to corresponding configurable elements, and each comprising:

one or more first inputs, each connected to either a first hardwired configuration bit or to a second hardwired configuration bit;

one or more second inputs, each connected to either the first hardwired configuration bit or to the second hardwired configuration bit; and a select circuit to selectively connect each output to either the corresponding first input or to the corresponding second input in response to a select signal;

wherein the first hardwired configuration bit is hardwired to one of a supply voltage and a around potential; and wherein the second hardwired configuration bit is hardwired to one of the supply voltage and the around potential.

43. The IC of claim 42, wherein the first hardwired configuration bit comprises a supply voltage and the second hardwired configuration bit comprises ground potential.

44. The IC of claim 42, wherein the first hardwired configuration bit configures a corresponding configurable element to a first state and the second hardwired configuration bit configures the corresponding configurable element to a second state.

45. The IC of claim 42, wherein the configuration control circuits do not include any memory cells.

46. The IC of claim 42, wherein the select circuit comprises a multiplexer.

47. A method of selectively configuring one or more configurable elements in an integrated circuit (IC), comprising:

generating a select signal; and selectively providing either a first hardwired configuration bit or a second hardwired configuration bit to the configurable elements in response to the select signal;

wherein the first hardwired configuration bit is hardwired to one of a supply voltage and a around potential; and wherein the second hardwired configuration bit is hardwired to one of the supply voltage and the around potential.

48. The method of claim 47, wherein the first hardwired configuration bit comprises a supply voltage and the second configuration bit comprises ground potential.

49. The method of claim 47, wherein the first and second hardwired configuration bits comprise a supply voltage.

50. The method of claim 47, wherein the first and second hardwired configuration bits comprise ground potential.

51. The method of claim 47, wherein the select signal is generated within the IC.

52. The method of claim 47, wherein the select signal comprises an input signal to the IC.

* * * * *